United States Patent [19]

Chakravarti et al.

[11] 4,287,571

[45] Sep. 1, 1981

[54] HIGH DENSITY TRANSISTOR ARRAYS

[75] Inventors: Satya N. Chakravarti, Troy, N.Y.; John A. Hiltebeitel, South Burlington, Vt.

[73] Assignee: International Business Machines Corporation, Armonk, N.Y.

[21] Appl. No.: 74,272

[22] Filed: Sep. 11, 1979

[51] Int. Cl.³ .................... G11C 17/00; G11C 11/40
[52] U.S. Cl. .................................. 365/104; 365/184; 357/45
[58] Field of Search .................... 365/104, 184, 185; 357/45; 340/166 R

[56] References Cited

U.S. PATENT DOCUMENTS

| | | |
|---|---|---|
| 3,056,113 | 9/1962 | Smith . |
| 3,706,976 | 12/1972 | Oleksiak ........................ 365/184 |
| 3,728,696 | 4/1973 | Polkinghorn .................. 365/104 |
| 3,851,317 | 11/1974 | Kenyon ......................... 365/184 |
| 4,021,789 | 5/1977 | Furman et al. ................ 357/54 |
| 4,031,524 | 6/1977 | Heeren ........................... 365/104 |
| 4,037,217 | 7/1977 | Savarese ........................ 365/104 |
| 4,059,826 | 11/1977 | Rogers ........................... 365/104 |
| 4,099,196 | 7/1978 | Simko ............................ 365/185 |
| 4,161,039 | 7/1979 | Rossler .......................... 365/185 |
| 4,180,826 | 12/1979 | Shappir .......................... 365/104 |
| 4,184,207 | 1/1980 | McElroy ........................ 365/104 |
| 4,193,125 | 3/1980 | Moriya .......................... 365/104 |

OTHER PUBLICATIONS

Altman, "Here Comes the Big New 64-K ROMS", Electronics, 3/30/78, pp. 94–99.

Primary Examiner—Stuart N. Hecker
Attorney, Agent, or Firm—Stephen J. Limanek

[57] ABSTRACT

An array of transistors suitable for use in a read only memory includes a plurality of spaced apart first conductive lines insulated from a semiconductor substrate and a plurality of spaced apart second conductive lines insulated from the substrate and from the first lines and disposed to intersect the first lines. Diffusion regions formed in the substrate as current carrying electrodes are defined by the first and second lines. A plurality of spaced apart third conductive lines are arranged to intersect the first and second lines and to connect to the diffusion regions. When the array is used in a read only memory, selected transistors of the array are made to have a different threshold voltage than that of the remaining transistors and the first and second lines form word lines, the third lines form bit or sense and ground lines and the diffusion regions form the source and drain regions of the transistors, with each diffusion region serving up to four transistors or cells.

24 Claims, 6 Drawing Figures

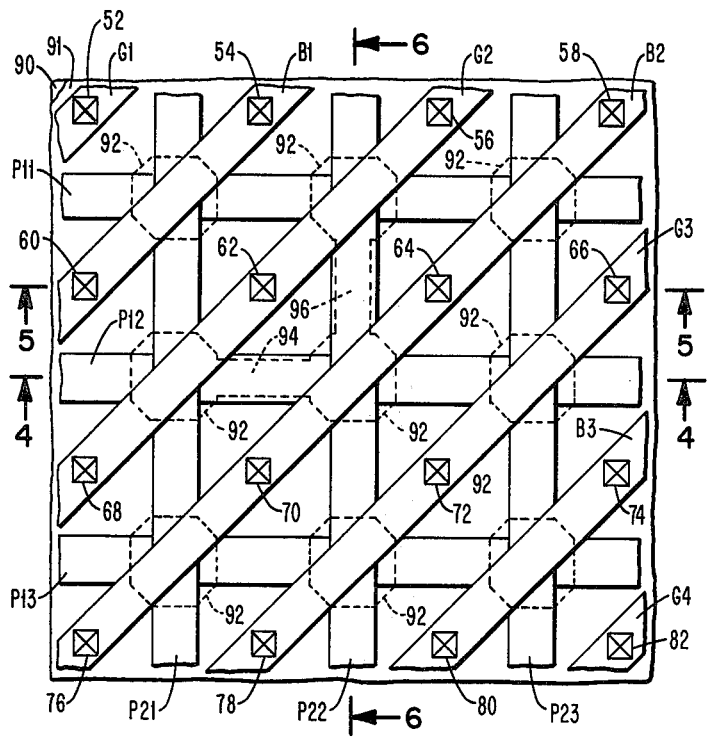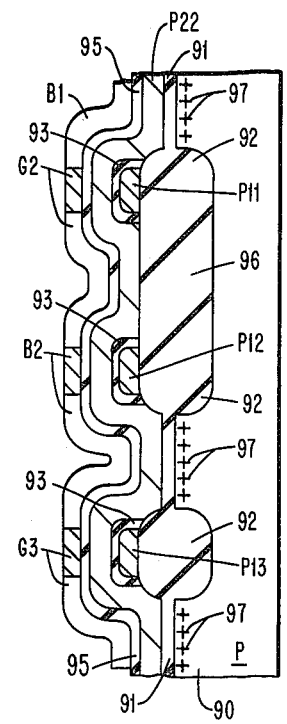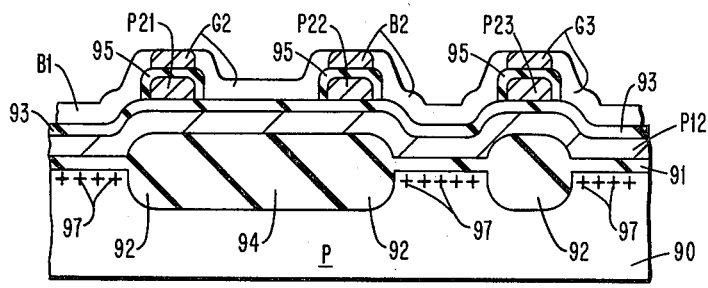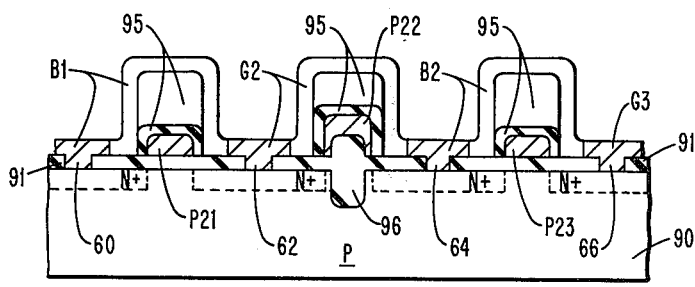
FIG. 3
FIG. 6
FIG. 4
FIG. 5

HIGH DENSITY TRANSISTOR ARRAYS

DESCRIPTION

1. Technical Field

This invention relates to integrated semiconductor circuits and more particularly to transistor arrays which may be used in read only memories having high cell densities.

2. Background Art

Integrated semiconductor circuits, particularly transistor arrays and memories having single transistor cells each of which represents a binary digit of information, as in read only memories (ROM), have achieved high device or cell densities.

In commonly assigned U.S. Pat. No. 4,021,789 filed by Anatol Furman, Howard L. Kalter and Johann W. Nagel on Sept. 29, 1975, there is disclosed a transistor array wherein the transistors are defined by parallelly arranged polysilicon lines and parallelly arranged isolation mediums to provide a high density of field effect transistors.

U.S. Pat. No. 4,031,524, filed Oct. 17, 1975, teaches a read only memory wherein cells are programmed with a pattern of operative and inoperative transistors by growing thin and thick gate oxides or dielectric layers, respectively, or by implantation of appropriate ions in selected gate channels so as to render these transistors inoperative. The operative transistors represent one digit of binary information, whereas the inoperative transistors represent the other digit of binary information.

U.S. Pat. No. 4,059,826, filed Dec. 29, 1975, discloses a read only memory wherein selected transistors forming the memory cells storing one digit of information are programmed by an ion implant step which produces in these transistors a threshold voltage of about zero to permanently turn on these transistors. The other digit of binary information is represented by transistors which do not have this ion implant and, therefore, have a higher threshold voltage.

U.S. Pat. No. 3,706,976, filed Nov. 5, 1972, describes a three dimensional selection technique for reading a variable threshold memory wherein a particular cell in an array is selected by applying three different voltages to the desired cell.

In U.S. Pat. No. 3,728,696, filed Dec. 23, 1971, there is disclosed a read only memory utilizing horizontally arranged word lines wherein a particular cell is selected by decoding word, sense and ground lines.

The article "Here Come the Big, New 64-K ROMs," in *Electronics,* Mar. 30, 1978, pp. 94–99, discloses a read only memory which requires only a one-half contact per cell since each cell shares a contact with another cell.

Commonly assigned U.S. Pat. No. 3,851,317, filed by R. A. Kenyon on May 4, 1973, discloses a memory having an array of non-volatile, variable threshold storage devices wherein a single sense amplifier is used to read each of two adjacent devices connected to a common point.

In U.S. Pat. No. 4,161,039, filed Feb. 6, 1978, there is disclosed an erasable programmable memory array utilizing field effect transistors wherein information is stored in floating gates and can be reprogrammed by erasing the stored information with ultraviolet light.

U.S. Pat. No. 3,056,113, filed Nov. 10, 1958, discloses magnetic core memories wherein selection of a storage element includes the use of vertical, horizontal and slant or zigzag lines.

SUMMARY OF THE INVENTION

It is an object of this invention to provide an improved high density transistor array with a high performance.

It is another object of this invention to provide an improved high density transistor array wherein elements are shared by a plurality of transistors.

It is still another object of this invention to provide an improved read only memory having a high density of transistors with high performance.

It is yet another object of this invention to provide an improved high performance read only memory wherein each cell in a semiconductor substrate utilizes a very small area of the substrate surface.

It is a further object of this invention to provide a read only memory wherein the small cells utilize substantially all of the substrate surface area in the cell array.

It is still a further object of this invention to provide a read only memory using a single transistor as a memory cell wherein substantially the entire semiconductor surface area of the cell array is used for gate electrodes and source and drain diffusions of the transistors and the thin dielectric layer under any of the gate electrodes may be made of equal thickness to that of the thin dielectric layer under any other gate electrode in the array.

It is yet a further object of this invention to provide a read only memory having a simple chip architecture with a small bit line pitch.

In accordance with the teachings of this invention, an array of transistors suitable for use in a read only memory is provided which includes a plurality of spaced apart first conductive lines insulated from a semiconductor substrate, a plurality of spaced apart second conductive lines insulated from the substrate and from the first lines and disposed to intersect the first lines, diffusion regions formed in the substrate and defined by the first and second lines and a plurality of spaced apart third conductive lines arranged to intersect the first and second lines and to connect to the diffusion regions. In the read only memory, the first and second lines form word lines, the third lines form bit and ground lines and the diffusion regions form source and drain regions of field effect transistors, with each diffusion region serving four transistors or cells.

In one embodiment of the invention, the first and second lines are made of doped polysilicon and the third lines are made of a metal such as aluminum, and the second lines are arranged orthogonal to the first lines with the third lines being disposed at approximately a 45° angle with respect to the first and second lines. Segments of the first and second lines defined by the adjacent orthogonal lines form the gate electrodes of the transistors. By modifying the threshold voltage of selected transistors, the selected transistors are used to represent one digit of binary information, whereas the remaining transistors represent the other digit of binary information.

The foregoing and other objects, features and advantages of the invention will be apparent from the following more particular description of the preferred embodiments of the invention, as illustrated in the accompanying drawing.

BRIEF DESCRIPTION OF THE DRAWING

FIG. 3 is a plan view of the transistor array of the memory illustrated in FIG. 1, FIG. 4 is a sectional view of the array of FIG. 3 taken through line 4—4 thereof, FIG. 5 is a sectional view of the array of FIG. 3 taken through line 5—5 thereof, and FIG. 6 is a sectional view of the array of FIG. 3 taken through line 6—6 thereof.

DESCRIPTION OF THE PREFERRED EMBODIMENTS

Figure 1:
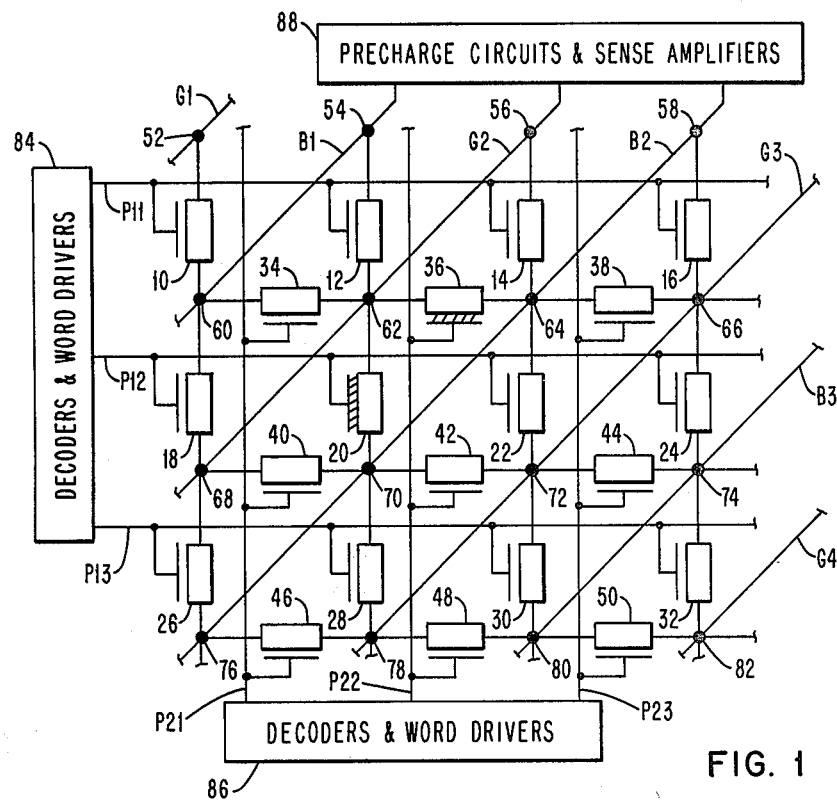
FIG. 1 is a schematic diagram of a read only memory having a transistor array of the present invention, FIG. 2 indicates a pulse program which may be used to operate the memory illustrated in FIG. 1.

Referring to FIG. 1 of the drawings in more detail there is shown a schematic diagram of one embodiment of the read only memory of the present invention. The read only memory includes a first horizontal word line P11 connected to the gate electrode of field effect transistors 10, 12, 14 and 16, a second horizontal word line P12 connected to the gate electrodes of field effect transistors 18, 20, 22 and 24 and a third horizontal word line P13 connected to the gate electrodes of field effect transistors 26, 28, 30 and 32. A first vertical word line P21 is connected to the gate electrodes of transistors 34, 40, and 46, a second vertical word line P22 is connected to the gate electrodes of transistos 36, 42 and 48 and a third vertical word line P23 is connected to the gate electrode of transistors 38, 44 and 50.

Source electrode contacts for transistors 10 and 14 are identified at 52 and 56, respectively, and drain electrode contacts for transistors 12 and 16 are identified at 54 and 58, respectively. A common drain electrode contact for transistors 10, 18 and 34 is identified at 60 and a common drain contact for transistors 14, 22, 36 and 38 is identified at 64. A common source electrode contact 62 is provided for transistors 12, 20, 34 and 36 and a common source contact 66 is provided for transistors 16, 24 and 38. Transistors 18, 26 and 40 have a common source electrode contact 68 and transistors 22, 30, 42 and 44 have a common source electrode contact 72.

Transistors 20, 28, 40 and 42 have a common drain electrode contact 70 and transistors 24, 32 and 44 have a common drain electrode contact 74. Common drain electrode contact 76 serves transistor 26 and transistor 46 and common drain electrode contact 80 serves transistors 30, 48 and 50. Common source electrode contact 78 serves transistors 28, 46 and 48 and common source electrode contact 82 serves transistors 32 and 50. A ground line G1 is connected to source electrode contact 52, a ground line G2 is connected to source electrode contacts 56, 62 and 68, a ground line G3 connects to source electrode contacts 66, 72 and 78 and a ground line G4 connects to source electrode contact 82. A bit line B1 is connected to drain electrode contacts 54 and 60, a bit line B2 is connected to drain electrode contacts 58, 64, 70 and 76 and a bit line B3 is connected to drain electrode contacts 74 and 80.

The horizontal word lines P11, P12 and P13 are connected to decoders and word drivers 84 which may be of any known suitable type and vertical word lines P21, P22 and P23 are connected to decoders and word drivers 86 which may be similar to the decoders and word drivers 84. If desired, decoders and word drivers 84 and 86 may be combined in any suitable manner. The ground lines G1, G2, G3 and G4 and the bit lines B1, B2 and B3 may be connected to any known suitable precharge circuits and sense amplifiers 88.

It should be noted that in the preferred embodiment, odd numbered ground lines G1, G3, . . . are connected together and even numbered ground lines G2, G4, . . . are connected together. Furthermore, various of the bit lines may be connected together to form groups, each having an equal number of bits, but in such a fashion that no single word line selects more than one transistor sharing the same bit line and ground line.

It should also be noted that all of the transistors illustrated in FIG. 1 of the drawing have a threshold voltage of a predetermined value, with the exception of transistors 20 and 36 which have a threshold voltage of a value different from that of the other transistors and preferably of a higher threshold voltage magnitude. The high threshold voltage transistors 20 and 36 are distinguished in the drawing from the other transistors by shaded lines indicated at the gate electrodes thereof. Although only two transistors have been indicated as having a high threshold voltage, it should be understood that the array may be programmed to have any desired number of high threshold voltage transistors.

Figure 2:
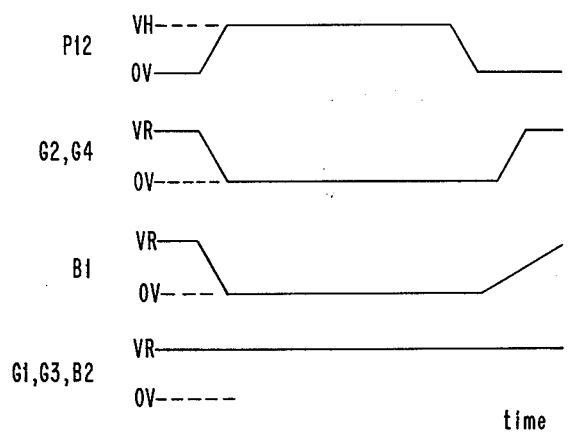

FIG. 2 of the drawing illustrates a pulse program which may be used to operate the read only memory illustrated in FIG. 1 of the drawing. To read information from the read only memory of FIG. 1, from cells associated with, e.g., word line P12, the voltage on all the word lines is maintained at zero potential and the bit lines B1, B2 and B3 and the ground lines G1, G2, G3 and G4 are all charged to a potential VR, less than or equal to VH which may be for example equal to +5 volts. After the bit lines and ground lines are charged, the voltage on word line P12 is raised to the voltage VH and the voltage on ground line G2 is lowered to zero potential, as indicated in FIG. 2 of the drawing. Since transistor 18 has a relatively low threshold voltage it turns on and a bit line B1 discharges through transistor 18 to the source electrode contact 68 which is at ground potential, as indicated in FIG. 2 of the drawings. However, since transistor 20 has a high threshold voltage, i.e., in excess of 5 volts, transistor 20 does not turn on even with the voltage VH on word line P12 and, therefore, the voltage on bit line B2 remains high, as indicated in FIG. 2 of the drawing. Accordingly, it can be seen that one digit of binary information such as a 0 is stored in transistor 18 and the other digit of binary information, 1, is stored in transistor 20, which information can be detected by the sense amplifiers 88 connected to bit lines B1 and B2. It should be noted that ground line G3 is also held in its high voltage position, that is, at VR, while the information in transistors 18 and 20 is being read out so that bit line B2 does not discharge through transistor 22. Likewise, the voltage on ground line G1 is held high when information is being read out on bit lines B1 and B2 to prevent false readings. It can be seen that in this manner one half of the cells connected to word line P12 are read out during one instance of time, and by a suitable selection of bit and ground lines, the remaining transistors connected to word line P12 may be read out at a second instance of time in a similar manner. It should also be noted that the transistors or cells connected to the vertical word lines P21, P22 and P23 are read out in a similar manner.

A detailed structure of an embodiment of the read only memory illustrated in FIG. 1 is shown in FIGS. 3, 4, 5 and 6 of the drawings. The read only memory includes a semiconductor substrate 90, of P-type conductivity, in which there are formed thick insulating oxide segments 92 and thick oxide strips 94 and 96 for forming high threshold voltage devices or transistors such as transistors 20 and 36 illustrated in FIG. 1 of the drawing. These segments and strips are preferably made of silicon dioxide. A thin layer of oxide 91 which may be made of silicon dioxide is formed on the surface areas of substrate 90 located outside of the thick oxide segments and strips. This thin oxide layer 91 may for example have a thickness of approximately 500 angstroms. A first layer of doped polysilicon is then deposited over the thin oxide layer 91 and thick oxide segments and strips 92, 94 and 96 and etched in a known manner to form the word lines P11, P12 and P13. These word lines P11, P12 and P13 are then covered by an insulating layer 93, which may be a self insulating layer from word lines P11, P12 and P13. The thin oxide layer 91 not protected by the horizontal word lines P11, P12 and P13 is removed and a new layer of thin oxide 91 having a thickness equal to the thickness of the thin oxide protected by the horizontal word lines P11, P12 and P13 is formed on the surface of substrate 90 to provide a gate oxide layer for the vertical polysilicon word lines P21, P22 and P23. A second layer of doped polysilicon is deposited on the surface of this structure and vertical word lines P21, P22 and P23 are etched from the second polysilicon layer so that the horizontal word lines P11, P12 and P13 from the first layer of polysilicon and the vertical word lines P21, P22 and P23 etched from the second layer of polysilicon cross each other over the thick oxide segments 92. The word lines may have a width of, e.g., 3.6 microns. An insulating layer 95 preferably made by self-oxidation of the vertical polysilicon word lines P21, P22 and P23 covers the vertical polysilicon word lines P21, P22 and P23, as indicated more clearly in FIGS. 4 and 6 of the drawings. It should be noted that with equal thin gate oxide thickness under both horizontal and vertical word lines all transistors representing a given digit of binary information have substantially the same threshold voltage magnitudes. Arsenic is then implanted into the surface of substrate 90 to form source and drain electrode diffusion regions defined by the horizontal and vertical polysilicon word lines P11, P12, P13, P21, P22 and P23. These diffusion regions are indicated in FIG. 5 as N+ regions. After the arsenic has been implanted, a layer of metal, for example, aluminum, is formed over this structure and etched to provide the slanted bit and ground lines B1, B2, B3, G1, G2, G3 and G4. If desired, the bit and ground lines may be made by employing known lift off techniques. Prior to forming the layer of metal, appropriate openings are made in the thin oxide layer 91 to define the source and drain electrode contacts such as indicated at 60, 62, 64 and 66, connected to the source and drain electrode N+ diffusions, as shown in FIG. 5 of the drawings.

It should be noted that prior to the formation of the first layer of doped polysilicon, boron ions 97, indicated in FIGS. 4 and 6 of the drawings, may be implanted into the surface of the semiconductor substrate 90 for surface or channel tailoring purposes, as is well known.

If desired the read only memory of the present invention may be programmed by implanting boron ions into the channel regions of the transistors which are to exhibit a high threshold voltage. Other known techniques such as by providing floating gates or variable threshold devices may also be employed to alter the threshold of selected cells in the read only memory of the present invention so as to form an erasble, programmable read only memory.

It can be seen, particularly from a study of the embodiment of the invention illustrated in FIGS. 3, 4, 5 and 6 that substantially the entire array area is used for gate electrodes and source and diffusions of the transistors or cells. The only surface of the semiconductor substrate 90 in the transistor array which is not used as part of the transistor cells is at the location of the thick oxide segments 92 at the intersection of the horizontal and vertical polysilicon word lines. It should be noted that each of the source and drain electrode contacts may be used to serve four transistors or cells of the memory resulting in only one half of a contact per cell. Furthermore, it should also be noted that the resistance of the polysilicon word lines can be minimized by growing a thin layer of metal silicide on the word lines in a known manner and thus very small propagation delay through the polysilicon word line is achieved.

It can be seen that a very high transistor or cell density has been provided in the high performance read only memory of the present invention by forming along with the horizontal word lines, vertical word lines having additional cells associated therewith, with precharge circuits and sense amplifiers being connected to the cells by metallic lines arranged at approximately 45° angle with respect to the horizontal and vertical word lines. This read only memory provides a very high density of cells with a simple architecture.

Although there is illustrated in the figures of the drawings, only a few cells associated with each word line, it should be understood that if desired at least 256 cells may be associated with each word line and that the number of word lines may be increased to at least 256. Furthermore, although the illustrated embodiment has been described as having a semiconductor substrate of P-type conductivity, it should be noted that a semiconductor substrate of N-type conductivity may be used, if desired, by interchanging the conductivities, such as the N and P regions in the substrate, as is known.

While the invention has been particularly shown and described with reference to preferred embodiments thereof, it will be understood by those skilled in the art that various changes in form and details may be made therein without departing from the spirit and scope of the invention.

What is claimed is:
1. A transistor array comprising:
  a semiconductor substrate of a first conductivity having a given surface region and a plurality of surface regions of a second conductivity opposite to that of said first conductivity,
  a plurality of first conductivity lines insulated from said substrate and arranged to define said given surface region and said plurality of surface regions, said given surface region being formed within an area defined on all sides by said plurality of conductive lines, and
  a plurality of second conductive lines, one of said second conductive lines being connected to said given surface region and the remaining lines of said plurality of second lines being connected to said plurality of surface regions,
  whereby a plurality of transistors is formed having a common current carrying electrode.

2. A transistor array as set forth in claim 1 wherein said plurality of first conductive lines includes a first pair of spaced apart lines and a second pair of spaced apart lines insulated from and arranged orthogonal to said first pair of lines defining said given surface region and wherein said second plurality of conductive lines are arranged to intersect with said first pair and with said second pair of spaced apart lines.

3. A transistor array as set forth in claim 2 wherein said plurality of first conductive lines is made of polysilicon and said plurality of second conductive lines is made of metal.

4. A transistor array as set forth in claim 2 wherein said plurality of first conductive lines includes a first pair of spaced apart parallel lines and a second pair of spaced apart parallel lines insulated from and arranged orthogonal to said first pair of lines defining said given surface region.

5. A transistor array as set forth in claim 4 wherein said first and second pair of lines are made of self insulatable material.

6. A transistor array as set forth in claim 5 wherein said self insulatable material is polysilicon and said plurality of second conductive lines is made of aluminum.

7. A transistor array as set forth in claim 1 wherein at least one of said transistors has a threshold voltage magnitude substantially different from that of the remaining transistors.

8. A transistor array comprising;
a semiconductor substrate having a given conductivity,
a plurality of insulating segments disposed in said substrate,
a plurality of first conductive lines insulated from said substrate and extending over said plurality of insulating segments, said plurality of first conductive lines having spaced apart lines arranged parallel to each other,
a plurality of second conductive lines insulated from said substrate and insulated from and intersecting said first conductive lines of said plurality of insulating segments, said plurality of second conductive lines having spaced apart lines arranged parallel to each other and orthogonal to the first conductive lines,
a plurality of surface regions in said substrate defined by said first and second conductive lines, said surface regions having a conductivity opposite to that of said given conductivity, and
a plurality of third conductive lines connected to said plurality of surface regions, said plurality of third conductive lines having spaced apart lines arranged parallel to each other and at approximately a 45° angle with respect to said first and second conductive lines.

9. A transistor array as set forth in claim 8 wherein said first and second conductive lines are made of doped polysilicon and said third conductive lines are made of aluminium.

10. A transistor array as set forth in claim 9 wherein two adjacent segments along said first and second conductive lines define a gate electrode of a transistor and wherein at least one of the transistors has a threshold voltage magnitude substantially different from that of the remaining transistors.

11. A read only memory comprising:
a transistor array including,
a semiconductor substrate having a given conductivity,
a plurality of insulating segments disposed in said substrate,
a plurality of first conductive lines insulated from said substrate and extending over said plurality of insulating segments,
a plurality of second conductive lines insulated from said substrate and insulated from and intersecting said first conductive lines at said plurality of insulating segments,
a plurality of surface regions in said substrate defined by said first and second conductive lines, said surface regions having a conductivity opposite to that of said given conductivity, and
a plurality of third conductive lines connected to said plurality of surface regions and arranged to intersect said plurality of first conductive lines and said plurality of second conductive lines, and
means coupled to said first, second and third lines for electrically interconnecting selected adjacent pairs of said surface regions.

12. A read only memory as set forth in claim 11 wherein said first and second conductive lines are word lines and said third conductive lines are bit and ground lines and wherein said means includes means for selectively applying word pulses to said word lines and means for precharging said bit and ground lines and for selectively discharging said ground lines.

13. A read only memory as set forth in claim 12 wherein said means coupled to said lines further includes means for sensing voltage on said bit lines.

14. An array of devices comprising:
a semiconductor substrate,
a plurality of diffusion regions disposed in said substrate,
a first set of parallel access lines coupled to said substrate,
a second set of parallel access lines coupled to said substrate, said second set of lines being arranged to intersect said first set of lines and to define said plurality of diffusion regions within said substrate,
a third set of parallel access lines contacting said diffusion regions and arranged to intersect said first and second sets of lines, and
means coupled to said first, second and third sets of lines for electrically interconnecting a selected pair of said diffusion regions.

15. A read only memory comprising:
a first serially-arranged plurality of transistors having common points between adjacent transistors,
a second serially-arranged plurality of transistors having common points between adjacent transistors.
a third serially-arranged plurality of transistors having common points between adjacent transistors, one of said common points in said first plurality of transistors being connected to a first common point of said third plurality of transistors and one of said common points in said second plurality of transistors being connected to a second common point of said third plurality of transistors,
a plurality of conductive lines connected to said common points, and
means for sensing charge on said conductive lines including,
means for precharging said conductive lines and means for applying a word pulse to gate electrodes of selected transistors and for discharging selected precharged lines.

16. A transistor array comprising:
a semiconductor substrate of a first conductivity having a given surface region and a plurality of surface regions of a second conductivity opposite of that of said first conductivity,
a plurality of first conductive lines insulated from said substrate and arranged to define said given surface region and said plurality of surface regions, said given surface region being formed within an area defined by said plurality of conductive lines, said plurality of first conductive lines including a first pair of spaced apart parallel lines and a second pair of spaced apart parallel lines insulated from and arranged orthogonal to said first pair of lines defining said given surface region, and
a plurality of second conductive lines, one of said second conductive lines being connected to said given surface region and the remaining lines of said plurality of second lines being connected to said plurality of surface regions, said plurality of second conductive lines being spaced apart and arranged parallel to each other and at substantial 45° angle with respect to said first and second pairs of lines, whereby a plurality of transistors is formed having a common current carrying electrode.

17. A read only memory comprising:
a transistor array including,
a semiconductor substrate having a given conductivity,
a plurality of insulating segments disposed in said substrate,
a plurality of first conductive lines insulated from said substrate and extending over said plurality of insulating segments, said plurality of first conductive lines having spaced apart lines arranged parallel to each other,
a plurality of second conductive lines insulated from said substrate and insulated from and intersecting said first conductive lines and said plurality of insulating segments, said plurality of second conductive lines having spaced apart lines arranged parallel to each other and orthogonal to the first conductive lines,
a plurality of surface regions in said substrate defined by said first and second conductive lines, said surface regions having conductivity opposite to that of said given conductivity, and
a plurality of third conductive lines connected to said plurality of surface regions, said plurality of third conductive lines having spaced apart lines arranged parallel to each other and at approximately a 45° angle with respect to said first and second conductive lines, and
means coupled to said first, second and third lines for electrical interconnecting selected adjacent pairs of said surface regions.

18. A read only memory as set forth in claim 17 wherein said first and second lines are made of doped polysilicon and said third lines are made of metal.

19. A read only memory as set forth in claim 18 wherein two adjacent insulating segments along said first and second conductive lines define a gate electrode of a transistor and wherein at least one of the transistors has a threshold voltage magnitude substantially different from that of the remaining transistors.

20. A read only memory as set forth in claim 19 wherein the gate electrode of the transistors having the different threshold voltage magnitude is spaced from said substrate by an insulating layer having a thickness substantially greater than that of the gate electrode of the remaining transistors.

21. A read only memory comprising:
a first plurality of serially-arranged transistors having common points between adjacent transistors,
a second plurality of serially-arranged transistors having common points between adjacent transistors, said second plurality of serially-arranged transistor being disposed parallel to said first plurality of serially-arranged transistors,
a third plurality of serially-arranged transistors having common points between adjacent transistors, one of said common points in said first plurality of transistors being connected to a first common point of said third plurality of transistors and one of said common points in said second plurality of said transistors being connected to a second common point of said third plurality of transistors, said third plurality of serially-arranged transistors being disposed orthogonal to said first and second pluralities of serially-arranged transistors,
a plurality of conductive lines connected to said common points, and
means for sensing charge on selected conductive lines including,
means for precharging said conductive lines and
means for applying a word pulse to gate electrodes to selected transistors and for discharging selected precharge lines.

22. A read only memory as set forth in claim 1 wherein said plurality of conductive lines has spaced apart lines arranged parallel to each other and at substantially a 45° angle with respect to said first, second and third plurality of serially arranged transistors.

23. A read only memory as set forth in claim 22 wherein selected transistors have a threshold voltage magnitude different from that of the remaining transistors and said word pulse has a magnitude intermediate that of the magnitudes of the threshold voltages of said selected transistors and of said remaining transistors.

24. A read only memory as set forth in claim 23 wherein the gate electrodes of said selected transistors are formed on insulating layers having a thickness greater than that of the insulating layers on which the gate electrodes of the remaining transistors are formed.

* * * * *